(12) United States Patent
Murata et al.

(10) Patent No.: US 11,508,607 B2
(45) Date of Patent: Nov. 22, 2022

(54) METHOD OF PROCESSING WORKPIECE AND RESIN SHEET UNIT

(71) Applicant: DISCO CORPORATION, Tokyo (JP)

(72) Inventors: Yosuke Murata, Tokyo (JP); Kazuhiro Koike, Tokyo (JP); Byeongdeck Jang, Tokyo (JP); Youngsuk Kim, Tokyo (JP); Takeshi Sakamoto, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 469 days.

(21) Appl. No.: 16/710,372

(22) Filed: Dec. 11, 2019

(65) Prior Publication Data

US 2020/0185255 A1   Jun. 11, 2020

(30) Foreign Application Priority Data

Dec. 11, 2018   (JP) .............................. JP2018-231764

(51) Int. Cl.
*H01L 21/683* (2006.01)
*H01L 21/304* (2006.01)
*B24B 37/27* (2012.01)

(52) U.S. Cl.
CPC .......... *H01L 21/6836* (2013.01); *B24B 37/27* (2013.01); *H01L 21/304* (2013.01); *H01L 2221/68327* (2013.01)

(58) Field of Classification Search
None
See application file for complete search history.

(56) References Cited

U.S. PATENT DOCUMENTS

| | | | | |
|---|---|---|---|---|
| 4,395,451 A | * | 7/1983 | Althouse | H01L 21/302 428/156 |
| 2002/0004359 A1 | * | 1/2002 | Arai | B24B 41/068 451/41 |
| 2002/0023340 A1 | * | 2/2002 | Arai | B24B 41/061 29/426.1 |
| 2002/0025656 A1 | * | 2/2002 | Arai | H01L 21/67132 257/E21.599 |
| 2018/0207904 A1 | * | 7/2018 | Varma | B32B 27/18 |
| 2020/0180101 A1 | * | 6/2020 | Murata | B24B 41/06 |

FOREIGN PATENT DOCUMENTS

JP   2003209080 A   7/2003

* cited by examiner

*Primary Examiner* — Erik T. K. Peterson
(74) *Attorney, Agent, or Firm* — Greer Burns & Crain Ltd.

(57) ABSTRACT

A method of processing a workpiece includes sticking an adhesive layer side of a resin sheet having a layered structure that includes an adhesive layer and a base material layer, to an annular frame having an opening in covering relation to the opening, forming surface irregularities on a face side of the base material layer that is opposite the adhesive layer, placing the face side of the workpiece and the face side of the base material layer in facing relation to each other and pressing the workpiece against the resin sheet or pressing the resin sheet against the workpiece, thereby bringing the workpiece into intimate contact with the resin sheet to fix the workpiece to the resin sheet, holding the face side of the workpiece fixed to the resin sheet on a holding surface of a chuck table, and grinding the reverse side of the workpiece with a grinding stone.

2 Claims, 14 Drawing Sheets

S40

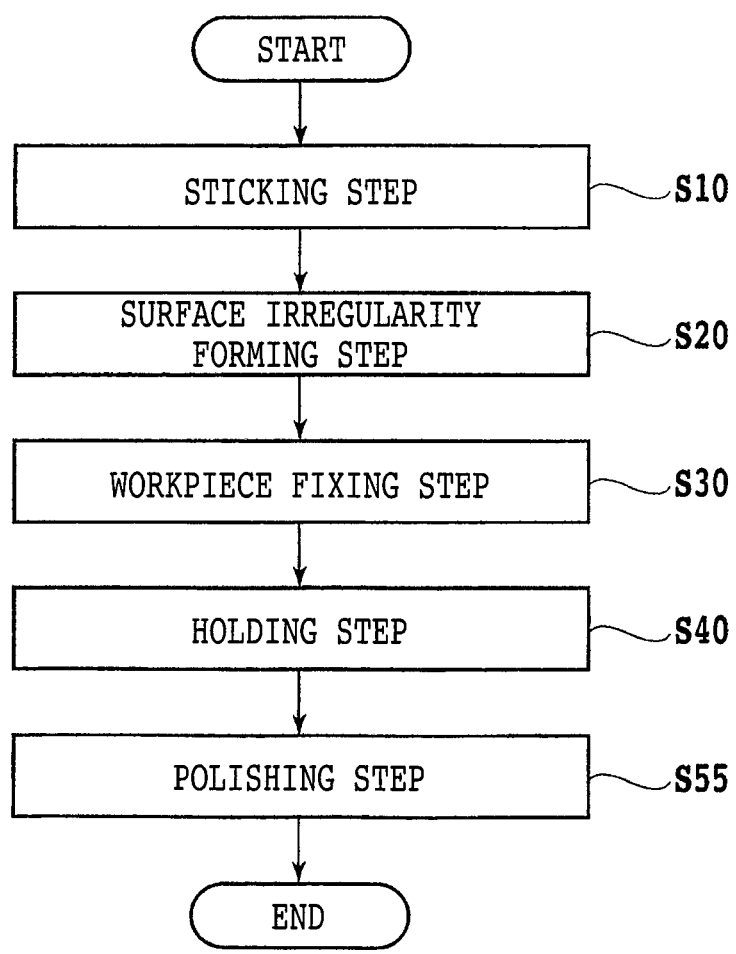

METHOD OF PROCESSING WORKPIECE AND RESIN SHEET UNIT

BACKGROUND OF THE INVENTION

Field of the Invention

The present invention relates to a method of processing a workpiece secured to an annular frame through a resin sheet.

Description of the Related Art

In a process of processing a wafer made of a semiconductor material or the like, it is known to stick a resin sheet for protecting devices formed on a face side of the wafer to the face side of the wafer, then to hold the face side of the wafer under suction on a chuck table, and to grind i.e., process, a reverse side of the wafer (see, for example, JP 2003-209080A). For example, before the reverse side of the wafer is ground, the face side of the wafer where the devices are formed in respective areas demarcated by a plurality of projected dicing lines i.e., streets, is cut along the projected dicing lines to form cut grooves in the wafer to a predetermined depth short of the reverse side of the wafer. Thereafter, the reverse side of the wafer is ground until the cut grooves are reached or exposed.

SUMMARY OF THE INVENTION

The resin sheet is normally of a layered structure including a base material layer and an adhesive layer. The resin sheet is stuck to the wafer by the adhesive layer that adheres to the face side of the wafer. However, when the resin sheet is peeled off from the wafer, the adhesive may be left on the face side of the wafer, i.e., adhesive residue may remain on the face side of the wafer. Particularly, wafers with bumps on the face sides thereof or wafers to be divided into small-size device chips need to have resin sheets firmly secured thereto. Therefore, the resin sheet contains an adhesive with strong adhesive power used in its adhesive layer, and hence the adhesive tends to remain on the face sides of the wafers. The present invention has been made in view of the above problems. It is an object of the present invention to provide a method of processing a workpiece without securing a resin sheet to the workpiece with an adhesive made of an adhesive resin.

In accordance with an aspect of the present invention, there is provided a method of processing a workpiece with devices formed on a face side thereof by grinding a reverse side of the workpiece until the workpiece is thinned to a predetermined finished thickness, including: sticking an adhesive layer side of a resin sheet having a layered structure that includes an adhesive layer and a base material layer, to an annular frame having an opening in covering relation to the opening; before or after sticking the adhesive layer side, forming surface irregularities on a face side of the base material layer that is opposite the adhesive layer; after sticking the adhesive layer side and forming the surface irregularities, placing the face side of the workpiece and the face side of the base material layer in facing relation to each other, and pressing the workpiece against the resin sheet or pressing the resin sheet against the workpiece, thereby bringing the workpiece into intimate contact with the resin sheet to fix the workpiece to the resin sheet; holding the face side of the workpiece fixed to the resin sheet on a holding surface of a rotatable chuck table; and after holding the face side of the workpiece, grinding the reverse side of the workpiece with a grinding stone mounted on a grinding wheel disposed in facing relation to the holding surface.

In accordance with another aspect of the present invention, there is provided a method of processing a workpiece with devices formed on a face side thereof by polishing a reverse side of the workpiece, including: sticking an adhesive layer side of a resin sheet having a layered structure that includes an adhesive layer and a base material layer, to an annular frame having an opening in covering relation to the opening; before or after sticking the adhesive layer side, forming surface irregularities on a face side of the base material layer that is opposite the adhesive layer; after sticking the adhesive layer side and forming the surface irregularities, placing the face side of the workpiece and the face side of the base material layer in facing relation to each other, and pressing the workpiece against the resin sheet or pressing the resin sheet against the workpiece, thereby bringing the workpiece into intimate contact with the resin sheet to fix the workpiece to the resin sheet; holding the face side of the workpiece fixed to the resin sheet on a holding surface of a rotatable chuck table; and after holding the face side of the workpiece, polishing the reverse side of the workpiece with a polishing pad disposed in facing relation to the holding surface.

In accordance with still another aspect of the present invention, there is provided a resin sheet unit for fixing a workpiece in intimate contact therewith, including: a resin sheet having an adhesive layer and a base material layer that is positioned opposite the adhesive layer, with surface irregularities formed on a face side of the base material layer that is opposite the adhesive layer, the surface irregularities being defined by grooves in the face side of the base material layer and remaining portions of the face side of the base material layer; and an annular frame having an opening larger in diameter than the workpiece, an adhesive layer side of the resin sheet being stuck to the annular frame in covering relation to the opening, in which the resin sheet unit fixes the workpiece to the annular frame by placing the face side of the workpiece and the face side of the base material layer in facing relation to each other and bringing the face side of the workpiece into intimate contact with the face side of the base material layer on which the surface irregularities are formed.

With the methods of processing workpieces according to the aspects of the present invention, the adhesive layer side of the resin sheet that includes the adhesive layer and the base material layer is stuck to the annular frame. Then, the surface irregularities are formed on the face side of the base material layer that is positioned opposite the adhesive layer. Thereafter, the workpiece is pressed against the resin sheet and hence is brought into intimate contact with the resin sheet and fixed thereto. Since no adhesive is used to fix the resin sheet to the workpiece, no adhesive remains on the workpiece when the workpiece is peeled off from the resin sheet.

The above and other objects, features, and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIG. 13 is a flowchart illustrating a workpiece processing method according to a second embodiment of the present invention;

DETAILED DESCRIPTION OF THE PREFERRED EMBODIMENTS

Figure 1:
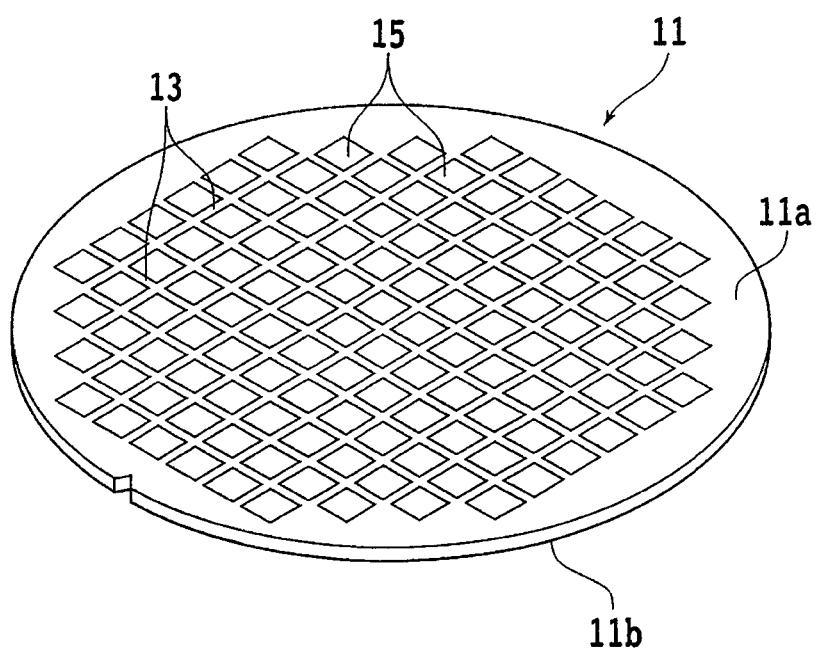
FIG. 1 is a perspective view of a workpiece.

Preferred embodiments of the present invention will hereinafter be described below with reference to the accompanying drawings. FIG. 1 illustrates in perspective a workpiece 11 to be processed by the preferred embodiments of the present invention. As described later, the preferred embodiments of the present invention include a first embodiment and a second embodiment. As illustrated in FIG. 1, the workpiece 11 is in the form of a disk-shaped wafer primarily made of a material such as silicon or the like, for example. The workpiece 11 has a face side 11a demarcated into a plurality of areas by a grid of projected dicing lines i.e., streets 13, with devices 15 such as integrated circuits (ICs) or the like disposed respectively in the areas. The workpiece 11 may be made of a semiconductor or an insulator other than silicon. Furthermore, the workpiece 11 is not limited to any shapes, structures, sizes, etc., and the devices 15 are not limited to any kinds, numbers, shapes, structures, sizes, layouts, etc.

Figure 2:
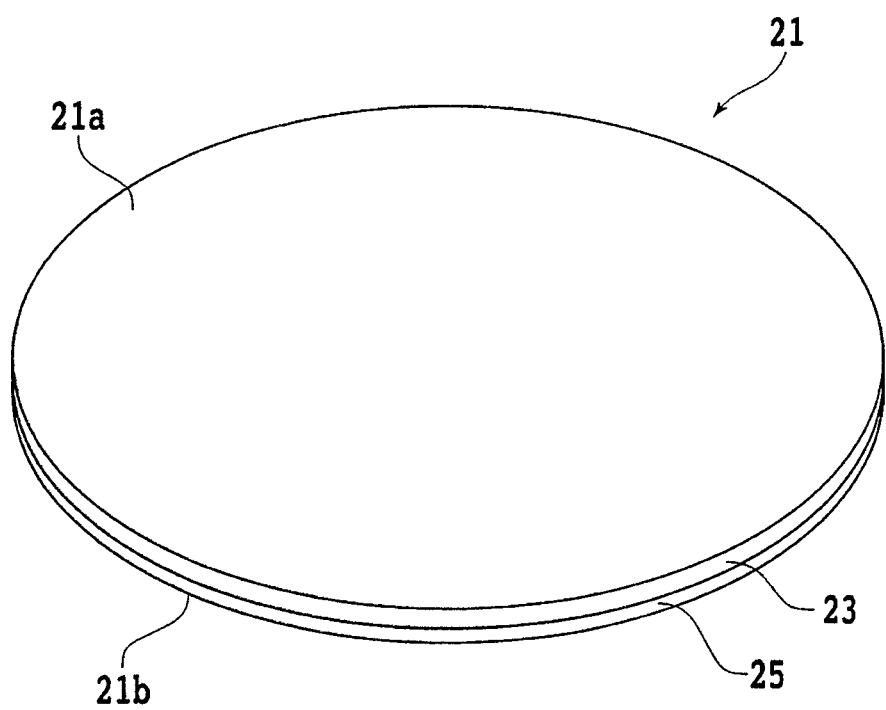
FIG. 2 is a perspective view of a resin sheet.

FIG. 2 illustrates in perspective a resin sheet 21 used in the methods of processing workpieces according to the preferred embodiments of the present invention. The resin sheet 21 is in the form of a circular film that is larger in diameter than the workpiece 11, and has a layered structure including a base material layer 23 and an adhesive layer 25. According to the preferred embodiments of the present invention, a surface, i.e., a face side, of the base material layer 23 that is opposite the adhesive layer 25 is referred to as a face side 21a of the resin sheet 21, whereas a surface of the adhesive layer 25 that is opposite the base material layer 23 as a reverse side 21b of the resin sheet 21. The face side 21a acts as an outer surface of the resin sheet 21 on the base material layer 23 side, and the reverse side 21b as an outer surface of the resin sheet 21 on the adhesive layer 25 side.

Figure 3:
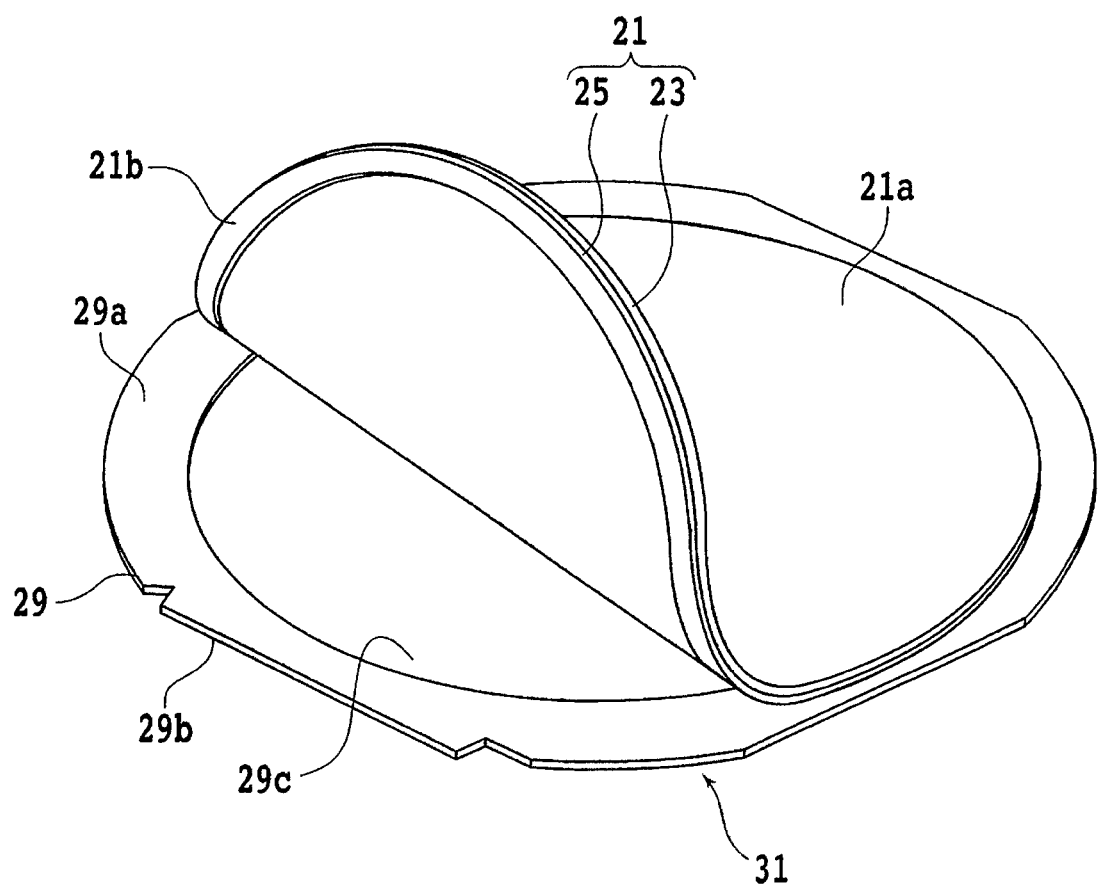
FIG. 3 is a perspective view illustrating a sticking step.

The base material layer 23 is in the form of a film-like solid layer having a circular shape. The base material layer 23 has a predetermined thickness ranging from 100 μm to 200 μm, and is made of a resin material such as polyolefin (PO), polyvinyl chloride (PVC), polyethylene terephthalate (PET), or the like, for example. The adhesive layer 25 is disposed in an annular pattern in the vicinity of an outer circumference of the other surface of the base material layer 23, i.e., a surface of the base material layer 23 that is opposite the face side 21a (See FIG. 3). The adhesive layer 25 is not limited to the annular pattern, but may be disposed entirely on the other surface of the base material layer 23. In this case, however, a non-adhesive cover layer of resin is additionally disposed on a predetermined area, e.g., an area corresponding to an opening 29c of an annular frame 29 to be described later. The adhesive layer 25 is in the form of a layer including an adhesive, i.e., a sticky compound, and is made of a material such as silicone rubber, acrylic resin, epoxy resin, or the like, for example. The adhesive layer 25 has such a nature that it will lose stickiness and be hardened upon exposure to an external stimulus such as ultraviolet rays or heat.

A method of processing the workpiece 11, or a workpiece processing method, according to the first embodiment of the present invention will hereinafter be described below with reference to FIGS. 3 through 11. In the workpiece processing method, initially, an annular frame 29 of metal is prepared. The annular frame 29 has an opening 29c that is larger in diameter than the workpiece 11 and smaller in diameter than the resin sheet 21. Then, the reverse side 21b of the resin sheet 21 is stuck to the annular frame 29 in covering relation to the opening 29c of the annular frame 29 (see FIG. 3), integrally combining the resin sheet 21 and the annular frame 29 with each other (sticking step (S10) (see FIG. 11)). According to the present embodiment, a surface of the annular frame 29 to which the resin sheet 21 is stuck is referred to as a face side 29a of the annular frame 29, whereas a surface of the annular frame 29 that is opposite the face side 29a as a reverse side 29b of the annular frame 29.

In the sticking step (S10), the annular adhesive layer 25 that is positioned on the reverse side 21b side of the resin sheet 21 is stuck to the face side 29a of the annular frame 29 using a sticking apparatus, not illustrated. The sticking apparatus has a support table, not illustrated, that supports the annular frame 29 thereon. The annular frame 29 is placed on the support table such that the reverse side 29b of the annular frame 29 is held in contact with a face side of the support table. A moving mechanism, not illustrated, such as a ball screw or the like is mounted on a reverse side of the support table. The support table can be moved along a predetermined direction by the moving mechanism. A cylindrical pressing roller, not illustrated, for pressing the resin sheet 21 toward the support table is disposed over the support table. The cylindrical pressing roller is rotatable about a central longitudinal axis thereof that extends perpendicularly to the predetermined direction referred to above along which the support table can be moved.

The sticking apparatus has a feed mechanism, not illustrated, that feeds a tape assembly, not illustrated, including a release sheet, not illustrated, stuck to the adhesive layer 25 side of the resin sheet 21 toward the pressing roller. The sticking apparatus also has a peeling unit, not illustrated, that peels off the resin sheet 21 from the release sheet when the resin sheet 21 is supplied to the region between the pressing roller and the annular frame 29. The release sheet peeled off from the tape assembly by the peeling unit is wound by a take-up mechanism, not illustrated. The take-up mechanism and the feed mechanism are adjusted such that the take-up mechanism winds the release sheet and the feed mechanism feeds the tape assembly at the same speed.

In the sticking step (S10), initially, the annular frame 29 is placed on the support table such that the face side 29a of the annular frame 29 faces upwardly. Then, the resin sheet 21 is placed between the pressing roller and the annular frame 29 such that the surface of the base material layer 23 side, i.e., the face side 21a of the resin sheet 21, is held in contact with the pressing roller and the surface of the adhesive layer 25 side, i.e., the reverse side 21b of the resin sheet 21, faces the support table. Then, the resin sheet 21 is delivered to the peeling unit by the feed mechanism and the take-up mechanism, and then peeled off from the release sheet by the peeling unit. Thereafter, the resin sheet 21 is pressed downwardly by the pressing roller and stuck to a portion of the annular frame 29 on the support table. Next, the feed mechanism and the take-up mechanism deliver the resin sheet 21 to the peeling unit, and the support table is moved along the predetermined direction referred to above while the resin sheet 21 is being pressed downwardly by the pressing roller. The feed mechanism, the take-up mechanism, and the moving mechanism referred to above are adjusted such that the resin sheet 21 is delivered over the support table and the support table is moved at the same speed.

While a region of the resin sheet 21 that is pressed by the pressing roller is being moved with respect to the support table, the reverse side 21b of the resin sheet 21 is brought into intimate contact with the face side 29a of the annular frame 29, so that the resin sheet 21 is stuck to the annular frame 29 in covering relation to the opening 29c of the annular frame 29. Now, a resin sheet unit 31 is jointly made up of the resin sheet 21 and the annular frame 29. The resin sheet 21, whose outer circumferential portion is fixed to the annular frame 29, is kept taut in radial directions of the resin sheet 21. Therefore, the resin sheet 21 is prevented from flexing under its own weight compared with the case in which the resin sheet 21 is not stuck to the annular frame 29. In the sticking step (S10) according to the present embodiment, the sticking apparatus is used as described above. However, the resin sheet 21 may be stuck to the annular frame 29 manually by a worker.

Figure 4:
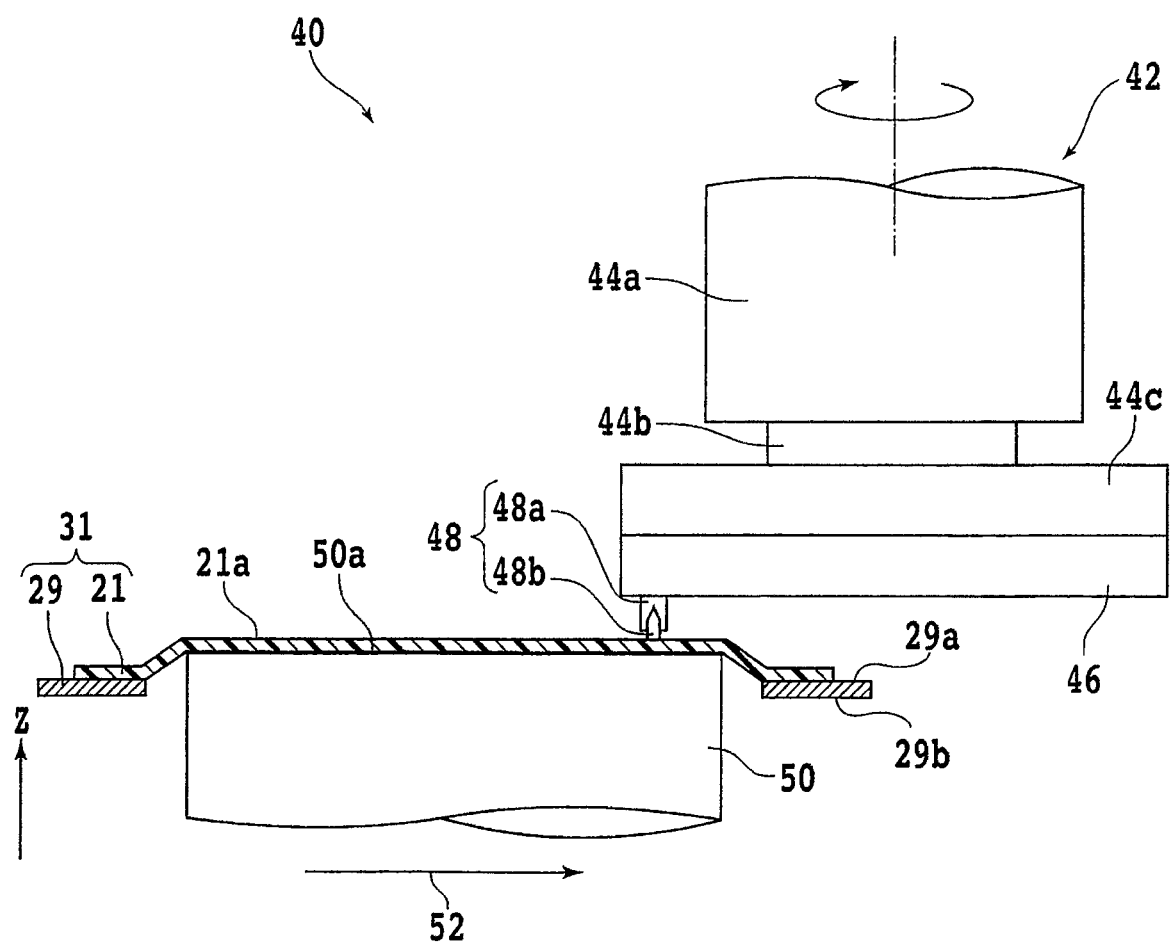
FIG. 4 is a partial cross-sectional side elevational view illustrating a surface irregularity forming step.
Figure 5:
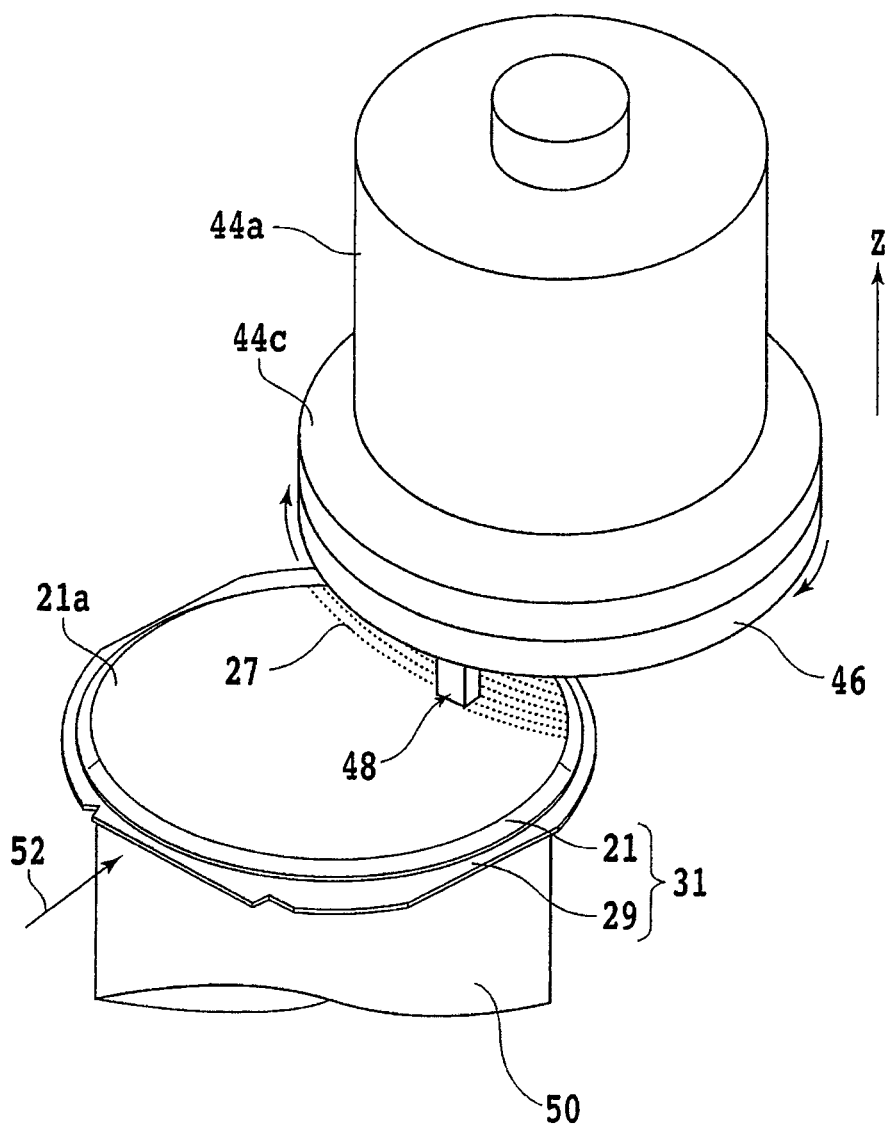
FIG. 5 is a perspective view illustrating the surface irregularity forming step.

After the sticking step (S10), surface irregularities are formed on the face side 21a of the resin sheet 21 using a cutting apparatus 40 (surface irregularity forming step (S20)). FIG. 4 illustrates in partial cross-sectional side elevation the surface irregularity forming step (S20). FIG. 5 illustrates in perspective the surface irregularity forming step (S20). The cutting apparatus 40 has a chuck table 50 having a substantially hollow cylindrical shape for holding the reverse side 21b of the resin sheet 21 of the resin sheet unit 31 under suction thereon. The chuck table 50 is coupled to a rotating mechanism having a rotary actuator, not illustrated, such as an electric motor or the like disposed therebelow. The chuck table 50 can be rotated about a rotational axis generally parallel to a vertical Z-axis by the rotating mechanism. The cutting apparatus 40 also includes a table moving mechanism, not illustrated, including a ball screw, etc., disposed beneath the chuck table 50. The chuck table 50 can be moved along a horizontal direction, e.g., a processing-feed direction indicated by the arrow 52, perpendicular to the Z-axis by the table moving mechanism. The chuck table 50 has an upper surface as a holding surface 50a for holding under suction the other surface side of the base material layer 23 of the resin sheet 21, i.e., the reverse side 21b side, thereon. The holding surface 50a is in the form of a disk-shaped surface of a porous plate that is made of a porous material. The porous plate is connected to a fluid channel, not illustrated, that is connected to a suction source, not illustrated, such as an ejector or the like.

A plurality of clamp mechanisms, not illustrated, are disposed laterally of the chuck table 50 in a manner to project from the chuck table 50. For example, four clamp mechanisms are disposed at circumferentially equal intervals around the chuck table 50. Each of the clamp mechanisms has a frame support, not illustrated, for placing the reverse side 29b of the annular frame 29 thereon. The frame supports are disposed in positions lower than the holding surface 50a. When the annular frame 29 is placed on the frame supports, the outer circumferential portion of the resin sheet 21 and the annular frame 29 are disposed in positions lower than the holding surface 50a.

The frame supports include rotational drive sources such as rotary actuators or the like. Arms are coupled respectively to the rotational drive sources. The arms are angularly movable in a predetermined angular range by the rotational drive sources. Frame pressers, not illustrated, are fixed to respective tips of the arms. The frame pressers are selectively disposed in a pressing position for pressing the face side 29a of the annular frame 29 placed on the frame supports and an open position for opening regions above the frame supports. When the annular frame 29 is to be placed onto the frame supports or the annular frame 29 is to be removed from the frame supports, the frame pressers are disposed in the open position.

The cutting apparatus 40 also includes a cutting tool unit 42 disposed above the chuck table 50. The cutting tool unit 42 has a tubular spindle housing 44a that is fixed to a Z-axis movable plate, not illustrated, that is movable along the Z-axis. The Z-axis movable plate is supported by a Z-axis moving mechanism, not illustrated. The spindle housing 44a houses a spindle 44b rotatably disposed therein that is coupled to a rotary actuator, not illustrated, such as an electric motor or the like. The spindle 44b has a lower end portion exposed out of a lower surface of the spindle housing 44a.

A disk-shaped wheel mount 44c is fixed to the lower end of the lower end portion of the spindle 44b. A disk-shaped cutting wheel 46 made of metal such as stainless steel, aluminum, or the like is mounted on a lower surface of the wheel mount 44c. A cutting tool 48 is mounted on a lower surface of the cutting wheel 46. The cutting tool 48 includes a substantially prism-shaped base 48a mounted on the cutting wheel 46 and a cutting blade 48b made of diamond or the like and fixed to the end of the base 48a that is opposite the cutting wheel 46.

In the surface irregularity forming step (S20), the resin sheet unit 31 is placed on the chuck table 50 such that the reverse side 21b of the resin sheet 21 is held in contact with the holding surface 50a and the reverse side 29b of the annular frame 29 is held in contact with the frame supports. At this time, the frame pressers are disposed in the open position. Thereafter, the suction source is actuated to generate and apply a negative pressure to the holding surface 50a, thereby holding the reverse side 21b side of the resin sheet 21 under suction on the chuck table 50. Then, the rotational drive sources of the frame supports are actuated to move the frame pressers to the pressing position. The annular frame 29 is now gripped and secured in position by the clamp mechanisms. At this time, the outer circumferential portion of the resin sheet 21 and the annular frame 29 are disposed in the positions lower than the holding surface 50a. The central portion of the resin sheet 21 positioned on the holding surface 50a is of a flat shape, whereas the outer circumferential portion of the resin sheet 21 is inclined downwardly from the central portion radially outwardly.

Then, the Z-axis moving mechanism is actuated to adjust the height of the cutting tool unit 42 along the Z-axis to position a lower cutting edge of the cutting blade 48b at a height where it contacts the face side 21a of the resin sheet 21. The rotary actuator is energized to rotate the cutting wheel 46 about its own vertical central axis. Then, the table moving mechanism moves the chuck table 50 under the cutting tool unit 42, causing the cutting tool 48 to cut the central portion of the face side 21a of the resin sheet 21.

Particularly, the chuck table 50 is moved linearly along the processing-feed direction so that the resin sheet unit 31 goes from one diametrical side of the cutting wheel 46 across an area directly below the spindle 44b to another opposite diametrical side of the cutting wheel 46. At this time, the chuck table 50 is not rotated about its own axis during movement along the processing-feed direction. The central portion of the face side 21a of the resin sheet 21 is thus cut by the cutting blade 48b. Specifically, the cutting tool 48 leaves a plurality of arcuate cut marks on the face side 21a of the resin sheet 21. To leave the cut marks, the cutting tool 48 scratches the face side 21a while being frictionally dragged over the face side 21a of the resin sheet 21 that is soft. Each of the arcuate cut marks includes a plurality of minute discrete grooves 27 (see FIGS. 5 and 6) that are separate along arcuate directions.

Figure 6:
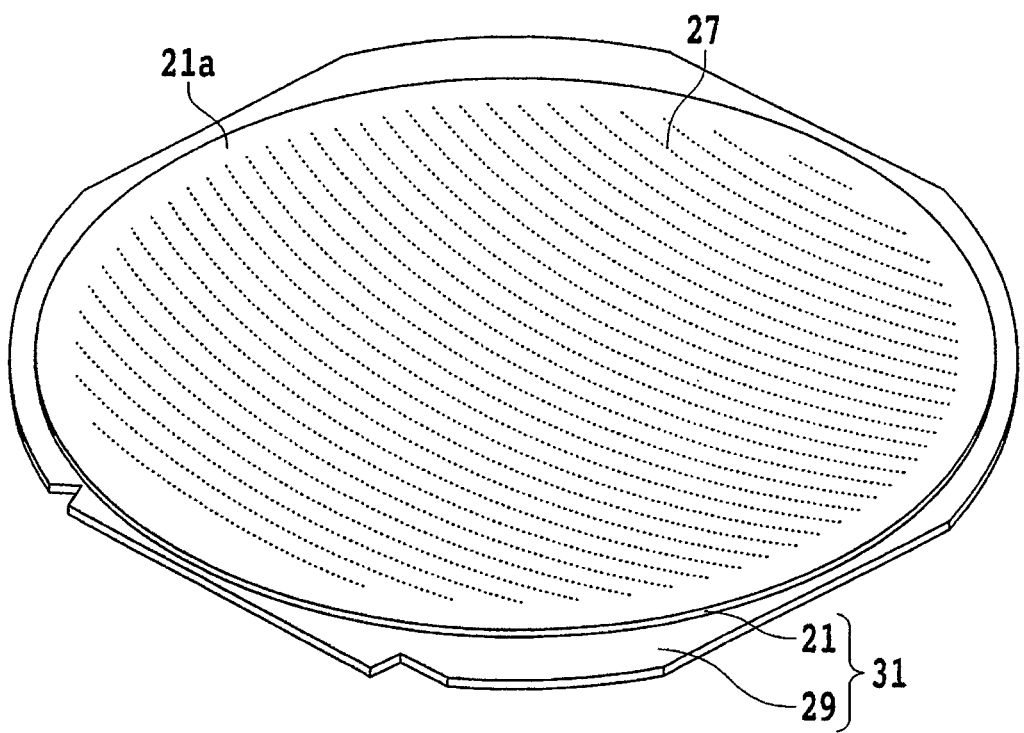
FIG. 6 is a perspective view illustrating a face side of the resin sheet after the surface irregularity forming step.

Each of the grooves 27 has a depth ranging from 0.1 μm to 0.3 μm from the face side 21a though it may have a depth of several micrometers or less, e.g., ranging from approximately 2 μm to 3 μm or may have a depth that is 3% or less of the thickness of the resin sheet 21. The grooves 27 are recessed in the face side 21a whereas the remaining portions of the face side 21a are protruded between the grooves 27. Therefore, the resin sheet 21 has surface irregularities on the face side 21a that are defined by the grooves 27 and the remaining portions of the face side 21a. FIG. 6 illustrates in perspective the face side 21a of the resin sheet 21 after the surface irregularity forming step (S20). In FIG. 6, the resin sheet unit 31 is illustrated as removed from the chuck table 50. According to the present embodiment, the surface irregularities are formed on the face side 21a by the cutting tool 48. However, the face side 21a may be scratched to form surface irregularities thereon by sandblasting, i.e., a step of forcibly applying an abrasive material on a stream of compressed air to the face side 21a. Alternatively, the face side 21a may be etched by plasma etching to form surface irregularities thereon.

According to still another way, while a disk-shaped grinding wheel, not illustrated, coupled to a lower end of a spindle, not illustrated, is being rotated by the spindle about the central axis of the spindle, a grinding stone, not illustrated, mounted on a bottom of the grinding wheel may be held in contact with the face side 21a to grind the face side 21a, thereby scratching the face side 21a to form surface irregularities thereon. In the surface irregularity forming step (S20), surface irregularities may be formed on a portion of the face side 21a of the resin sheet 21 rather than on the entire face side 21a. For example, surface irregularities may be formed on only a region of the face side 21a where the workpiece 11 will be placed in a workpiece fixing step (S30) to be described below.

Figure 7:
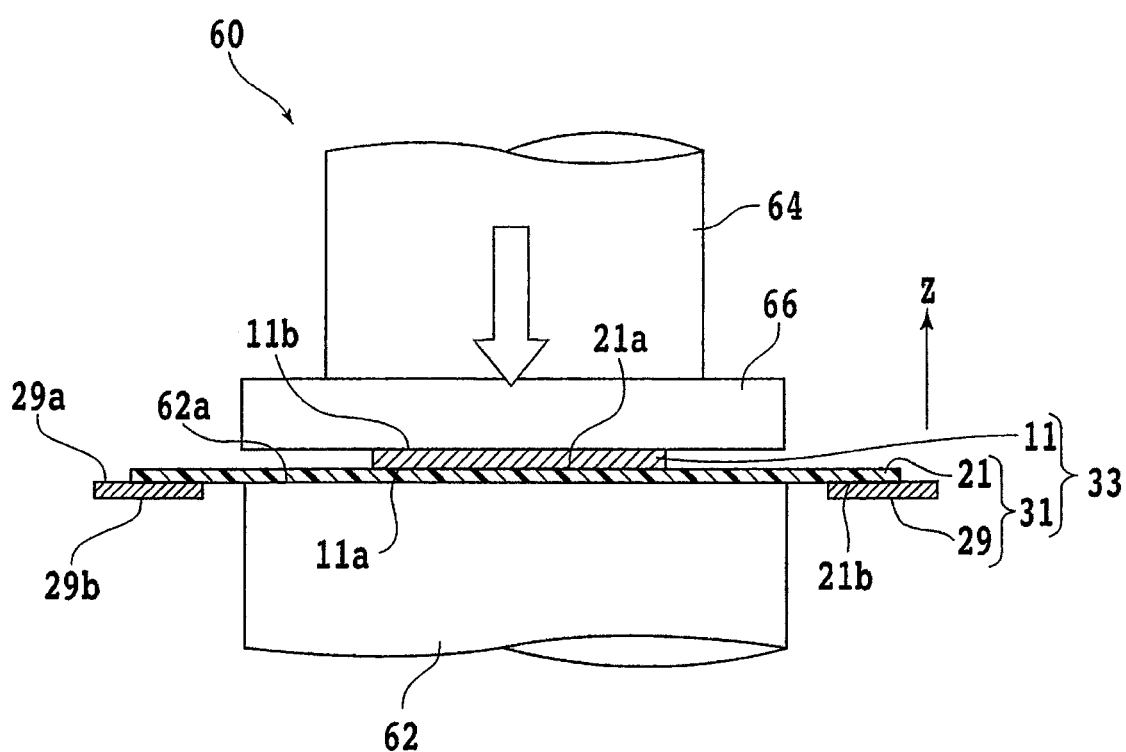
FIG. 7 is a partial cross-sectional side elevational view illustrating a workpiece fixing step.

After the surface irregularity forming step (S20), the workpiece 11 is pressed against the resin sheet 21 such that the face side 11a of the workpiece 11 and the face side 21a of the base material layer 23 face each other, so that the workpiece 11 is fixed to the resin sheet 21 in intimate contact therewith (workpiece fixing step (S30)). FIG. 7 illustrates in partial cross-sectional side elevation the workpiece fixing step (S30). The workpiece fixing step (S30) is carried out using a pressing apparatus 60 illustrated in FIG. 7. The pressing apparatus 60 includes a chuck table 62 having a porous plate, not illustrated, in an upper surface thereof.

The porous plate is connected to a fluid channel, not illustrated, connected to a suction source, not illustrated, such as an ejector or the like. When the suction source is actuated, it generates and applies a negative pressure to the porous plate. An upper surface of the porous plate now functions as a holding surface 62a of the chuck table 62 that holds the resin sheet unit 31 under suction thereon. A substantially disk-shaped flat pressing plate 66 made of metal or the like is disposed in facing relation to the chuck table 62. The pressing plate 66 is larger in diameter than the workpiece 11, for example. The pressing plate 66 has a surface remote from the chuck table 62 and connected to a lower end of a cylindrical rod 64 extending along the Z-axis. The rod 64 has an upper end that is opposite the pressing plate 66 and that is coupled to a lifting and lowering mechanism, not illustrated, including an electric motor, etc. When the rod 64 is lifted or lowered by the lifting and lowering mechanism, the pressing plate 66 is lifted away from or lowered toward the holding surface 62a of the chuck table 62.

In the workpiece fixing step (S30), initially, the resin sheet unit 31 is placed on the holding surface 62a of the chuck table 62 such that the face side 21a of the resin sheet 21 faces upwardly. Then, the suction source is actuated to hold the reverse side 29b of the resin sheet unit 31 under suction on the holding surface 62a. Then, the workpiece 11 is placed on the face side 21a such that the face side 11a of the workpiece 11 is held in contact with the face side 21a. The lifting and lowering mechanism lowers the pressing plate 66, pressing the pressing plate 66 against the reverse side 11b of the workpiece 11. The pressing plate 66 is pressed against the reverse side 11b of the workpiece 11 by a force ranging from several newtons (N) to several tens of newtons (N). At this time, heat may be applied to at least one of the workpiece 11 and the resin sheet 21.

When the disk-shaped flat pressing plate 66 presses the workpiece 11 for a period of time ranging from several seconds to several tens of seconds, for example, a substantially uniform force is applied along the Z-axis to the workpiece 11. The face side 11a of the workpiece 11 thus pressed is brought into intimate contact with the face side 21a of the resin sheet 21. After having pressed the workpiece 11, the pressing plate 66 is lifted away from the workpiece 11. The face side 11a of the workpiece 11 and the face side 21a of the resin sheet 21 remain in intimate contact with each other or air has been removed from between them, creating a vacuum therebetween. Therefore, even after the pressing plate 66 has been separated from the workpiece 11, the workpiece 11 and the resin sheet 21 remain pressed against each other under the atmospheric pressure.

At this time, the grooves 27 function as suction cups, keeping the workpiece 11 fixed to the annular frame 29 through the resin sheet 21 thereby to form a workpiece unit 33. In the workpiece unit 33, the workpiece 11 is disposed on the face side 21a side and the annular frame 29 on the reverse side 21b side. This layout is unique to the present embodiment in which the resin sheet 21 and the workpiece 11 are not fixed to each other by the adhesive layer 25. The resin sheet 21 is not stuck to the workpiece 11 by an adhesive layer, but stuck to the workpiece 11 through the surface irregularities formed on the face side 21a of the base material layer 23 of the resin sheet 21. Consequently, even if the workpiece 11 is peeled off from the resin sheet 21, no adhesive remains on the workpiece 11. The workpiece unit 33 is also advantageous in that the resin sheet 21 can be manufactured inexpensively as a protective tape because it does not contain an adhesive to be applied to the workpiece 11. In the workpiece fixing step (S30), the workpiece 11 is not permanently fixed to the resin sheet 21, but temporarily fixed to the resin sheet 21. The workpiece 11 and the resin sheet 21 are fixed to each other thicknesswise by being pressed against each other under the atmospheric pressure. However, when air is introduced between the workpiece 11 and the resin sheet 21, the resin sheet 21 can easily be peeled off from the workpiece 11.

According to the present embodiment, the pressing apparatus 60 is used to press the workpiece 11 and the resin sheet 21 against each other. However, the workpiece 11 may be pressed against the face side 21a of the resin sheet 21 manually by a worker. Alternatively, the chuck table 62 and the pressing plate 66 may be positioned upside down, i.e., in a vertically reversed layout, and the reverse side 11b of the workpiece 11 may be held under suction on the chuck table 62 in a manner for the workpiece 11 to be suspended from above. Then, the resin sheet unit 31 placed on the pressing plate 66 may be lifted and pressed against the workpiece 11 such that the face side 11a of the workpiece 11 and the face side 21a of the resin sheet 21 face each other.

Figure 8A:
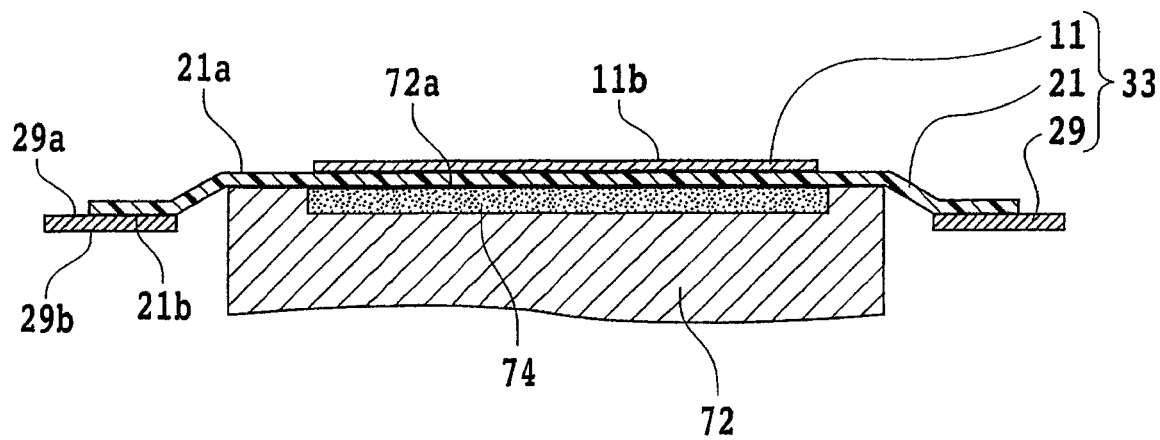
FIG. 8A is a cross-sectional view illustrating a holding step.
Figure 8B:
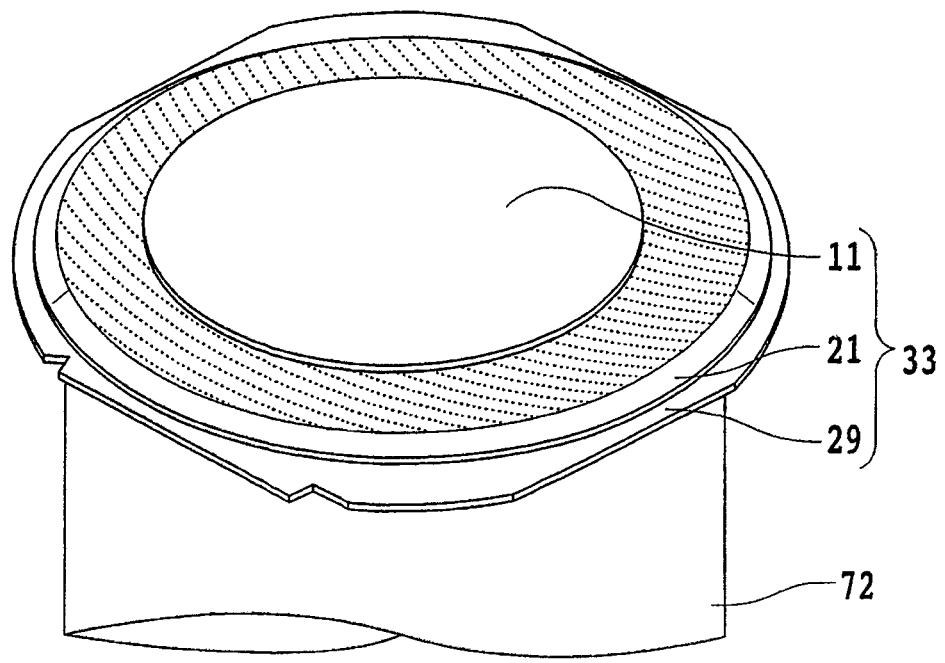
FIG. 8B is a perspective view illustrating the holding step.

After the workpiece fixing step (S30), the workpiece 11 is processed. For processing, i.e., grinding, the reverse side 11b of the workpiece 11 according to the present embodiment, the face side 11a of the workpiece 11 is held on a holding surface 72a (see FIG. 8A) of a chuck table 72 of a grinding apparatus 70 (see FIG. 9) (holding step (S40)), to be described later. FIG. 8A illustrates the holding step (S40) in cross section, and FIG. 8B illustrates the holding step (S40) in perspective. The chuck table 72 has a porous plate 74 in its upper surface. The porous plate 74 is connected to a fluid channel, not illustrated, that is connected to a suction source, not illustrated, such as an ejector or the like. When the suction source is actuated, it generates and applies a negative pressure to the porous plate 74. An upper surface of the porous plate 74 now functions as the holding surface 72a of the chuck table 72. The chuck table 72 is coupled to a rotating mechanism having a rotary actuator, not illustrated, such as an electric motor or the like disposed therebelow. The chuck table 72 can be rotated about a rotational axis generally parallel to a vertical Z-axis by the rotating mechanism. A plurality of clamp mechanisms, not illustrated, are disposed laterally of the chuck table 72 in a manner to project from the chuck table 72. Since the clamp mechanisms are identical to the clamp mechanisms of the cutting apparatus 40, their description will be omitted below.

In the holding step (S40), initially, the workpiece unit 33 is placed on chuck table 72 such that the reverse side 21b of the resin sheet 21 is held in contact with the holding surface 72a and the reverse side 29b of the annular frame 29 is held in contact with the frame supports. At this time, the frame pressers are disposed in the open position. The suction source then applies a generated negative pressure to the holding surface 72a to hold the reverse side 21b of the resin sheet 21 under suction on the chuck table 72.

Figure 9:
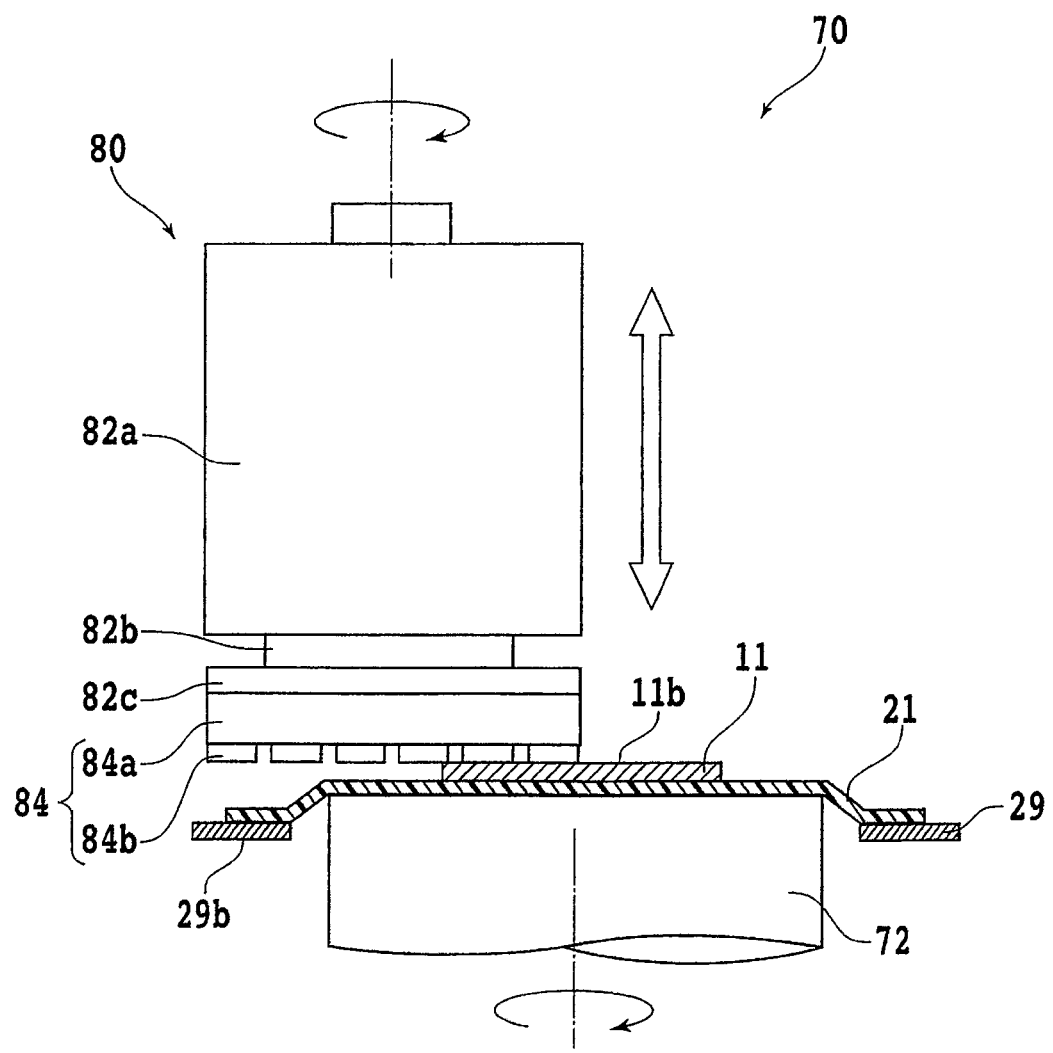
FIG. 9 is a partial cross-sectional side elevational view illustrating a grinding step.
Figure 10:
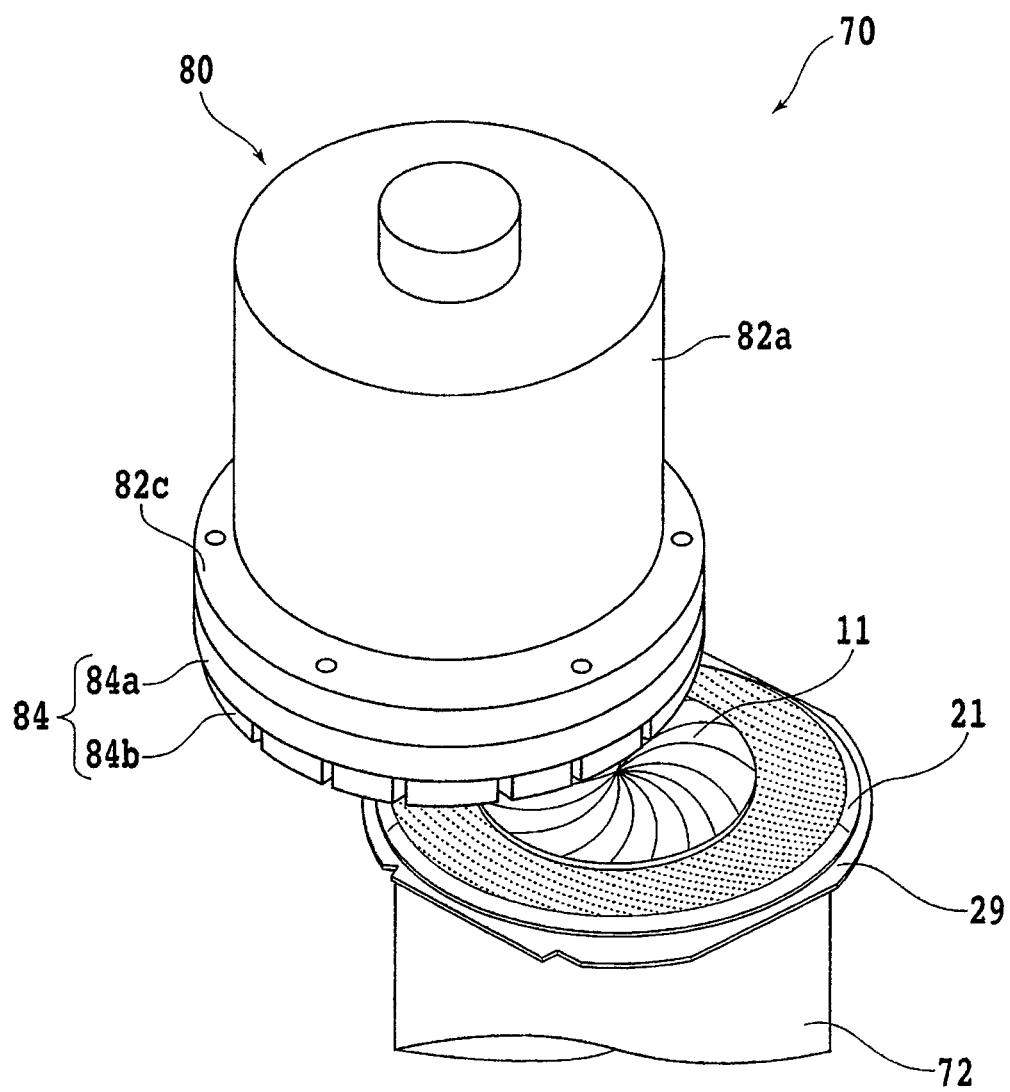
FIG. 10 is a perspective view illustrating the grinding step.

Then, the rotational drive sources of the frame supports are actuated to move the frame pressers to the pressing position. The face side 29a and reverse side 29b of the annular frame 29 are now gripped and secured in position by the clamp mechanisms. At this time, since the outer circumferential portion of the resin sheet 21 and the annular frame 29 are disposed in the positions lower than the holding surface 72a, the central portion of the resin sheet 21 positioned on the holding surface 72a is of a flat shape, whereas the outer circumferential portion of the resin sheet 21 is inclined downwardly from the central portion radially outwardly. After the holding step (S40), the reverse side 11b of the workpiece 11 is ground (grinding step (S50)). FIG. 9 illustrates the grinding step (S50) in partial cross-sectional side elevation, and FIG. 10 illustrates the grinding step (S50) in perspective.

The grinding step (S50) is carried out using the grinding apparatus 70. The grinding apparatus 70 includes, in addition to the chuck table 72, a grinding unit 80 disposed in facing relation to the holding surface 72a of the chuck table 72. The grinding unit 80 has a tubular spindle housing 82a. The spindle housing 82a has a side surface including a portion fixed to a Z-axis movable plate, not illustrated, that is movable along the Z-axis. The spindle housing 82a houses therein a spindle 82b that is rotatable about its own vertical central axis. The spindle 82b has an upper end portion coupled to a rotary actuator, not illustrated, such as an electric motor or the like for rotating the spindle 82b about its own vertical central axis. The spindle 82b has a lower end portion exposed out of a lower surface of the spindle housing 82a. A disk-shaped wheel mount 82c is fixed to the lower end of the lower end portion of the spindle 82b.

A grinding wheel 84 is mounted on a lower surface of the wheel mount 82c that is opposite the spindle 82b. The grinding wheel 84 is generally equal in diameter to the wheel mount 82c and has an annular wheel base 84a made of metal such as stainless steel or the like. The wheel base 84a has an annular surface as a mount surface mounted on the wheel mount 82c. The wheel base 84a also has another annular surface that is positioned opposite the mount surface and that supports a plurality of grinding stones 84b secured thereto in an annular array. The grinding stones 84b are made of a binder such as of metal, ceramics, resin, or the like mixed with abrasive grains of diamond, cubic boron nitride (cBN), or the like. The binder and the abrasive grains are not limited to any particular materials and may be made of materials selected according to the specifications of the grinding stones 84b.

Figure 11:
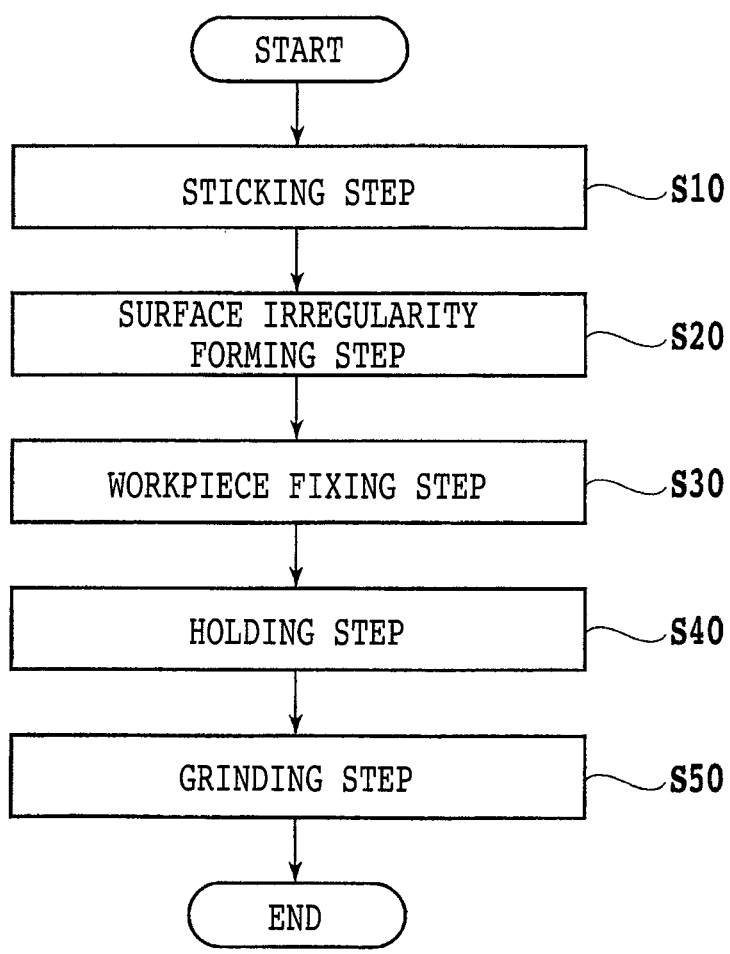
FIG. 11 is a flowchart illustrating a workpiece processing method according to a first embodiment of the present invention.

In the grinding step (S50), the grinding unit 80 is lowered along the Z-axis while the chuck table 72 and the grinding unit 80 are being rotated in one direction about their own axes. When respective lower surfaces of the grinding stones 84b that are in turning motion are brought into contact with the reverse side 11b of the workpiece 11, the grinding stones 84b start grinding the reverse side 11b of the workpiece 11. When the reverse side 11b has been ground to thin the workpiece 11 to a predetermined finished thickness, the grinding step (S50) is finished. In a case where the workpiece 11 is to be peeled off from the resin sheet unit 31 after the grinding step (S50), an external stimulus such as ultraviolet rays or heat is applied to the adhesive layer 25 to harden the adhesive layer 25, which then loses its stickiness. The annular frame 29 can now easily be peeled off from the resin sheet 21. Then, an end of the resin sheet 21 is turned up, and air is introduced between the workpiece 11 and the resin sheet 21. The resin sheet 21 is now peeled off from the workpiece 11. FIG. 11 is a flowchart illustrating the workpiece processing method according to the first embodiment as described above.

According to a first modification of the surface irregularity forming step (S20) according to the first embodiment, the surface irregularity forming step (S20) may be carried out to form surface irregularities on the face side 21a of the resin sheet 21 prior to the sticking step (S10). For example, while the release sheet side of the resin sheet 21 to which the release sheet is stuck, i.e., the reverse side 21b side thereof, is being held under suction on the holding surface 50a of the chuck table 50, the cutting tool unit 42 cuts the face side 21a of the resin sheet 21, forming surface irregularities on the face side 21a. Thereafter, the sticking step (S10) is carried out, followed successively by the workpiece fixing step (S30), the holding step (S40), and the grinding step (S50).

Figure 12:
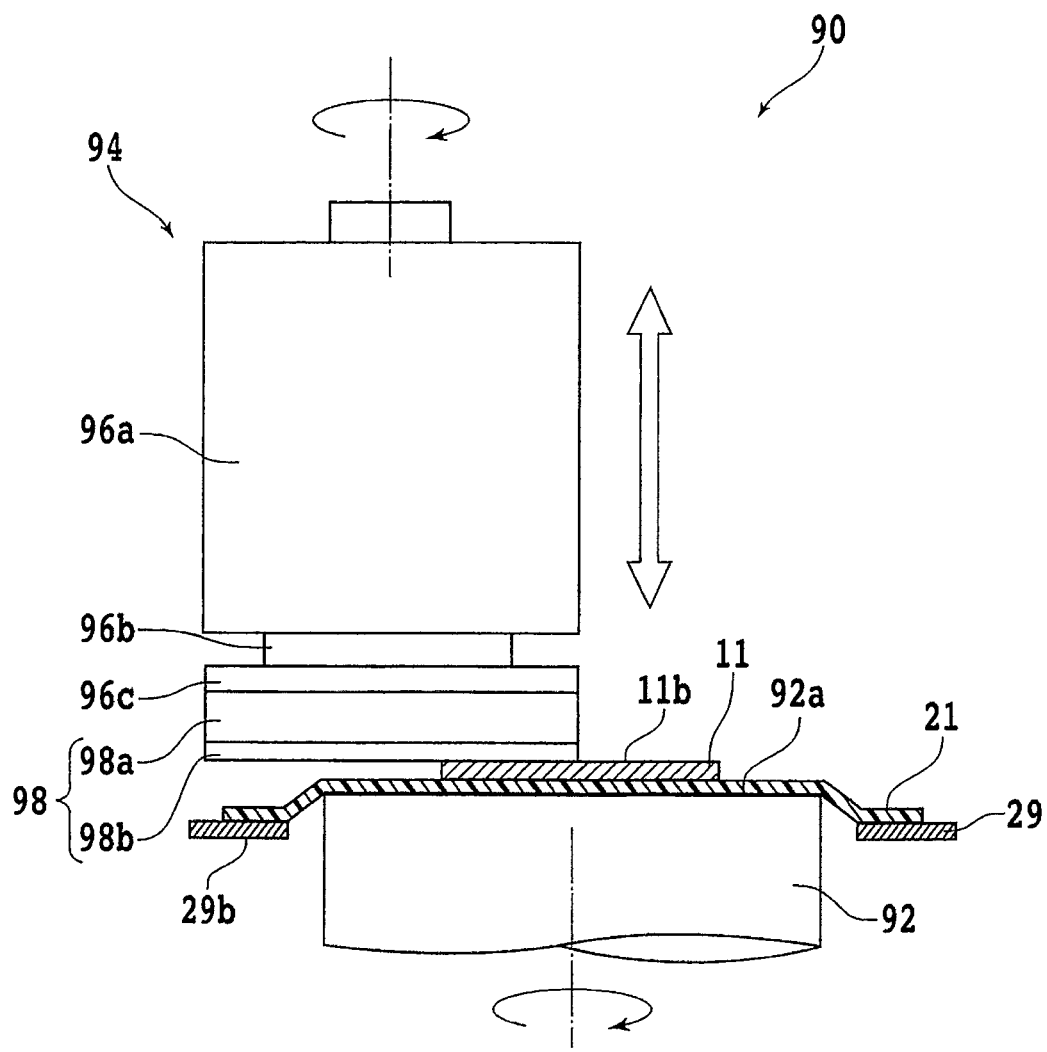
FIG. 12 is a partial cross-sectional side elevational view illustrating a polishing step.

A method of processing the workpiece 11, or a workpiece processing method, according to the second embodiment of the present invention will hereinafter be described below with reference to FIGS. 12 and 13. The method of processing the workpiece 11 according to the second embodiment includes a polishing step (S55) for polishing the reverse side 11b of the workpiece 11 instead of the grinding step (S50) according to the first embodiment. The method of processing the workpiece 11 according to the second embodiment includes a sticking step (S10), a surface irregularity forming step (S20), a workpiece fixing step (S30), and a holding step (S40) which are similar to those according to the first embodiment. The polishing step (S55) is carried out after the holding step (S40) in which a chuck table 92 (see FIG. 12) of a polishing apparatus 90 holds the workpiece unit 33. FIG. 13 is a flowchart illustrating the workpiece processing method according to the second embodiment. The processing step (S55) is carried out using the polishing apparatus 90 having the chuck table 92. The chuck table 92 has a porous plate, not illustrated, in an upper surface thereof. The porous plate is connected to a fluid channel, not illustrated, that is connected to a suction source, not illustrated, such as an ejector or the like.

When a negative pressure generated by a suction source acts on the porous plate, an upper surface of the porous plate functions as a holding surface 92a of the chuck table 92. The chuck table 92 is coupled to a rotating mechanism having a rotary actuator, not illustrated, such as an electric motor or the like disposed therebelow. The chuck table 92 can be rotated about a rotational axis generally parallel to a vertical Z-axis by the rotating mechanism. The chuck table 92 is identical in structure to the chuck table 72 of the grinding apparatus 70, and its description will be omitted below. The polishing apparatus 90 has, in addition to the chuck table 92, a polishing unit 94 disposed in facing relation to the holding surface 92a of the chuck table 92. The polishing unit 94 has a tubular spindle housing 96a. The spindle housing 96a has a side surface including a portion fixed to a Z-axis movable plate, not illustrated, that is movable along the Z-axis. The Z-axis movable plate is supported on a Z-axis moving mechanism, not illustrated. The spindle housing 96a houses therein a spindle 96b that is rotatable about its own vertical central axis.

The spindle 96b has an upper end portion coupled to a rotary actuator, not illustrated, such as an electric motor or the like for rotating the spindle 96b about its own vertical central axis. The spindle 96b has a lower end portion exposed out of a lower surface of the spindle housing 96a. A disk-shaped wheel mount 96c is fixed to the lower end of the lower end portion of the spindle 96b. A polishing wheel 98 is mounted on a lower surface of the wheel mount 96c that is opposite the spindle 96b. The polishing wheel 98 is generally equal in diameter to the wheel mount 96c and has a disk-shaped wheel base 98a made of metal such as stainless steel or the like. The wheel base 98a has a disk-shaped surface as a mount surface mounted on the wheel mount 96c. The wheel base 98a also has another disk-shaped surface that is positioned opposite the mount surface and that supports a disk-shaped polishing pad 98b secured thereto. The polishing pad 98b is made of abrasive grains dispersed in urethane foam and secured by a bonding agent. The abrasive grains are made of green silicon carbide (GC), white fused alumina (WA), diamond, cBN, or the like. The urethane foam may be replaced with nonwoven fabric.

In the polishing step (S55), the polishing unit 94 is lowered along the Z-axis while the chuck table 92 and the polishing unit 94 are being rotated in one direction about their own axes. When a lower surface of the polishing pad 98b that is in rotation is brought into contact with the reverse side 11b of the workpiece 11, the polishing pad 98b starts polishing the reverse side 11b of the workpiece 11. According to a first modification of the second embodiment, the surface irregularity forming step (S20) may be carried out to form surface irregularities on the face side 21a of the resin sheet 21 prior to the sticking step (S10). After the surface irregularity forming step (S20), the sticking step (S10) may be carried out, followed successively by the workpiece fixing step (S30), the holding step (S40), and the polishing step (S55).

Figure 14A:
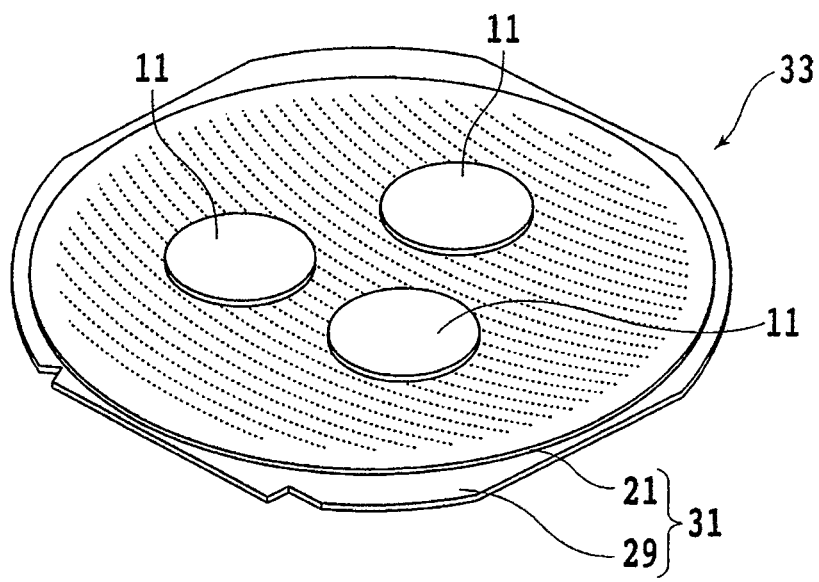
FIG. 14A is a perspective view illustrating a plurality of disk-shaped workpieces fixed to a resin sheet.
Figure 14B:
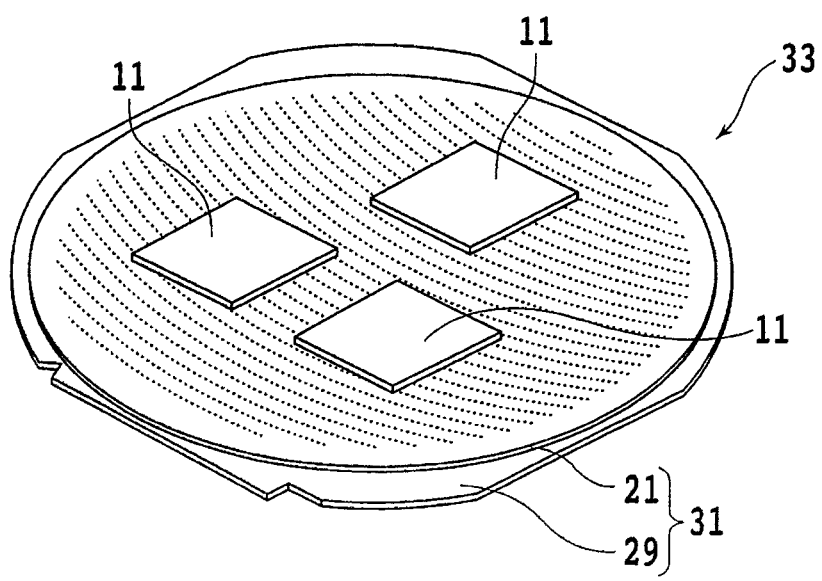
FIG. 14B is a perspective view illustrating a plurality of workpieces, which are of a rectangular shape as viewed in plan, fixed to a resin sheet.

In the first embodiment and the second embodiment described above, one workpiece 11 is fixed to the face side 21a of the resin sheet unit 31. However, a plurality of workpieces 11 may be fixed to the face side 21a of the resin sheet unit 31. FIG. 14A illustrates in perspective a plurality of disk-shaped workpieces 11 that are fixed to the resin sheet 21 in the holding step (S40), illustrating the workpiece unit 33 as removed from the chuck table 62 used in the workpiece fixing step (S30). In FIG. 14A, three workpieces 11 are fixed to the resin sheet 21. However, two or four or more disk-shaped workpieces 11 may be fixed to the resin sheet 21. The workpieces 11 may not necessarily be disk-shaped, but may be of a rectangular shape. FIG. 14B illustrates in perspective a plurality of rectangular workpieces 11, as viewed in plan, that are fixed to the resin sheet 21 in the holding step (S40), illustrating the workpiece unit 33 as removed from the chuck table 62 used in the workpiece fixing step (S30). Two or four or more rectangular workpieces 11 may be fixed to the resin sheet 21.

The structural details, the methods, etc., according to the above embodiments may be changed or modified within the scope of the present invention. For example, after each step of the workpiece processing methods has been carried out from the sticking step (S10) to the holding step (S40) according to their sequence, the workpiece 11 supported on the annular frame 29 may be observed, measured, or conveyed in another step instead of the grinding step (S50) or the polishing step (S55). In the step of observing, measuring, or conveying the workpiece 11 that is included in the workpiece unit 33, the workpiece 11 can be handled easily compared with the workpiece 11 handled alone, i.e., not supported on annular frame 29. As described above, when the workpiece 11 is peeled off from the resin sheet 21, no adhesive remains on the workpiece 11. The resin sheet 21 that has been used once may be reused. However, on the used resin sheet 21, the grooves 27 tend to have become wider than when they were formed and are less likely to function as suction cups. Consequently, if the used resin sheet 21 is to be reused, it is preferable to perform the surface irregularity forming step (S20) on the reused resin sheet 21 to regenerate surface irregularities on the face side 21a thereof.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of processing a workpiece with devices formed on a face side thereof by grinding a reverse side of the workpiece until the workpiece is thinned to a predetermined finished thickness, comprising:
   sticking an adhesive layer side of a resin sheet having a layered structure that includes an adhesive layer and a base material layer, to an annular frame having an opening in covering relation to the opening;
   before or after sticking the adhesive layer side, forming surface irregularities on a face side of the base material layer that is opposite the adhesive layer;
   after sticking the adhesive layer side and forming the surface irregularities, placing the face side of the workpiece and the face side of the base material layer in facing relation to each other, and pressing the workpiece against the resin sheet or pressing the resin sheet against the workpiece, thereby bringing the workpiece into intimate contact with the resin sheet to fix the workpiece to the resin sheet;
   holding the face side of the workpiece fixed to the resin sheet on a holding surface of a rotatable chuck table; and
   after holding the face side of the workpiece, grinding the reverse side of the workpiece with a grinding stone mounted on a grinding wheel disposed in facing relation to the holding surface.

2. A method of processing a workpiece with devices formed on a face side thereof by polishing a reverse side of the workpiece, comprising:
   sticking an adhesive layer side of a resin sheet having a layered structure that includes an adhesive layer and a base material layer, to an annular frame having an opening in covering relation to the opening;
   before or after sticking the adhesive layer side, forming surface irregularities on a face side of the base material layer that is opposite the adhesive layer;
   after sticking the adhesive layer side and forming the surface irregularities, placing the face side of the workpiece and the face side of the base material layer in facing relation to each other, and pressing the workpiece against the resin sheet or pressing the resin sheet against the workpiece, thereby bringing the workpiece into intimate contact with the resin sheet to fix the workpiece to the resin sheet;
   holding the face side of the workpiece fixed to the resin sheet on a holding surface of a rotatable chuck table; and
   after holding the face side of the workpiece, polishing the reverse side of the workpiece with a polishing pad disposed in facing relation to the holding surface.

* * * * *